United States Patent
Jeon et al.

(10) Patent No.: US 9,754,770 B2
(45) Date of Patent: Sep. 5, 2017

(54) METHOD AND APPARATUS OF DIAGNOSING PLASMA IN PLASMA SPACE

(71) Applicant: Samsung Electronics Co., Ltd., Suwon-Si, Gyeonggi-Do (KR)

(72) Inventors: Kyung-Yub Jeon, Yongin-si (KR); Jeong-Yun Lee, Yongin-si (KR); Chin-Wook Chung, Seoul (KR)

(73) Assignees: Samsung Electronics Co., Ltd., Gyeonggi-do (KR); Industry-University Cooperation Foundation Hanyang University, Seoul (KR)

( * ) Notice: Subject to any disclaimer, the term of this patent is extended or adjusted under 35 U.S.C. 154(b) by 586 days.

(21) Appl. No.: 14/200,318

(22) Filed: Mar. 7, 2014

(65) Prior Publication Data
US 2014/0253092 A1   Sep. 11, 2014

(30) Foreign Application Priority Data

Mar. 11, 2013   (KR) .................... 10-2013-0025384

(51) Int. Cl.
*G01N 27/62* (2006.01)
*G01R 31/00* (2006.01)
*H01J 37/32* (2006.01)

(52) U.S. Cl.
CPC .. *H01J 37/32954* (2013.01); *H01J 37/32935* (2013.01)

(58) Field of Classification Search
CPC .................... H01J 37/32954; H01J 37/32935

USPC ...................... 324/71.1, 750.2, 464
See application file for complete search history.

(56) References Cited

U.S. PATENT DOCUMENTS

| | | | |
|---|---|---|---|
| 7,696,758 B2 | 4/2010 | Chung et al. | |
| 8,080,479 B2 | 12/2011 | Collins et al. | |
| 8,175,827 B2 | 5/2012 | Walker et al. | |
| 8,190,366 B2 | 5/2012 | Boris et al. | |
| 2008/0012588 A1* | 1/2008 | Lee | G01R 1/07342 324/756.04 |
| 2008/0265903 A1* | 10/2008 | Chung | H05H 1/0081 324/464 |
| 2012/0086422 A1* | 4/2012 | Ito | H02M 3/156 323/284 |

FOREIGN PATENT DOCUMENTS

| | | |
|---|---|---|
| JP | 2010-232110 A | 10/2010 |
| KR | 10-0663176 B1 | 1/2007 |
| KR | 10-0784824 B1 | 12/2007 |
| KR | 10-0988704 B1 | 10/2010 |

* cited by examiner

*Primary Examiner* — Farhana Hoque
(74) *Attorney, Agent, or Firm* — Harness, Dickey & Pierce, P.L.C.

(57) ABSTRACT

To diagnose plasma in a plasma space, a plurality of floating probes are installed at a plurality of points, respectively, in a plasma space. An electron density ratio at each of the points is calculated by measuring a first probe current of each of the floating probes, the probe current including a DC component. A point ion density and a point electron temperature at each of the points are calculated by measuring a second probe current of each of the floating probes before the electron density ratio is calculated, the second probe current excluding the DC component.

19 Claims, 9 Drawing Sheets

METHOD AND APPARATUS OF DIAGNOSING PLASMA IN PLASMA SPACE

CROSS-REFERENCE TO RELATED APPLICATION

This application claims priority under 35 USC §119 to Korean Patent Application No. 10-2013-0025384 filed on Mar. 11, 2013 in the Korean Intellectual Property Office (KIPO), the entire disclosure of which is incorporated herein by reference.

BACKGROUND

Field

At least one example embodiment relates to a method and/or an apparatus for diagnosing plasma in a plasma space. More particularly, at least one example embodiment relates to a method and/or an apparatus for diagnosing plasma, capable of diagnosing the spatial distribution of plasma in a plasma process chamber by using floating probes.

Discussion of the Related Art

Among the various devices used to fabricate semiconductor devices, a plasma device is widely used to form plasma inside a sealed process chamber maintained in a vacuum state, and to inject reactive gas into the chamber to deposit a thin film on a wafer or etch the thin film formed on the wafer. The plasma device may be applied to various fields because the process may be performed at a low temperature in which impurities in an impurity region formed in the wafer are not diffused. Plasma devices are also used for forming a thin film having a superior uniformity of thickness on a wafer with a large diameter. Plasma devices are also useful for achieving etch uniformity throughout the whole wafer when a thin film is etched. A Langmuir probe has been extensively used as a device capable of analyzing characteristics of plasma, namely ion and electron distribution, by measuring parameters of the plasma in the plasma device. The Langmuir probe employs a floating probe in order to measure the electron temperature and the ion density of plasma.

The floating probe is connected to a plasma medium through a capacitor to cut off a DC component of current generated by the floating probe, which minimizes an influence exerted on the plasma medium by the probe such that plasma potentials are static and electrically float. Accordingly, ion density and electron temperature of the plasma are calculated from probe current having an AC component without the DC component. In general, the electron density in an apparatus for diagnosing plasma is derived from the ion density because the electron density is not easily calculated. Because the ion density is equal to the electron density in positive plasma, the calculation of the electron density for positive plasma is not required. However, because the ion density is expressed as the sum of a negative ion density and an electron density for negative plasma, the calculation of the electron density is desired to more accurately diagnose the plasma characteristics.

SUMMARY

At least one example embodiment provides a method and/or an apparatus for diagnosing plasma in a plasma space by calculating the spatial distribution of the electron density of the plasma.

At least one example embodiment provides a method and/or an apparatus for diagnosing plasma in a plasma space by calculating the electron density using the ratio in the magnitude of probe current between two points.

At least one example embodiment provides a method and/or an apparatus for diagnosing plasma in a plasma space by predicting charging damage.

According to at least one example embodiment, an apparatus for diagnosing plasma in a plasma space includes a plurality of floating probes arranged at a plurality of points, respectively, in a plasma space. The apparatus includes a processor configured to calculate an electron density ratio at each of the points based on a first probe current of each of the floating probes, the first probe current including a DC component.

According to at least one example embodiment, the processor is configured to calculate a point ion density and a point electron temperature at each of the points based on a second probe current of each of the floating probes before calculating an electron density ratio, the second probe current excluding the DC component.

According to at least one example embodiment, the processor is configured to measure the first probe current by coupling a signal generator to each of the floating probes, and measure the second probe current by connecting a DC cut-off capacitor between the signal generator and each of the floating probes.

According to at least one example embodiment, the processor is configured to calculate the electron density using a first harmonic component in the first probe current.

According to at least one example embodiment, the floating probes are arranged in a two-dimensional plane at a substantially same height in the plasma space.

According to at least one example embodiment, a height of the floating probes corresponds to a height of a wafer in a wafer plasma process chamber.

According to at least one example embodiment, the two-dimensional plane has a shape substantially identical to a shape of a wafer.

According to at least one example embodiment, an apparatus for diagnosing plasma in a plasma space includes a plurality of floating probes arranged at a plurality of points, respectively, in a plasma space. The apparatus includes a sensor plate on which the floating probes are uniformly arranged, a signal generator configured to generate an AC signal, and a sensor circuit including a plurality of current sensing resistors connected to the signal generator. The apparatus includes a DC select circuit including a plurality of DC switch circuits, each of the DC switch circuits being connected in series between each of the current sensing resistors and each of the floating probes. Each of the DC switch circuits is configured to control an electrical connection between each of the current sensing resistors and each of the floating probes in response a control signal. The apparatus includes a processor unit configured to generate the control signal to control the DC select circuit, measure a potential difference across each of the current sensing resistors, and calculate plasma parameters based on the measured potential differences.

According to at least one example embodiment, each of the DC switch circuits includes a first switch, a second switch, a DC cut-off capacitor and a connection wire. T first switch includes a first common terminal configured to receive the AC signal from the signal generator and first and second select terminals. The second switch includes a second common terminal configured to connect to each of the floating probes and third and fourth select terminals. The DC cut-off capacitor is configured to connect between the first select terminal of the first switch and the third select terminal of the second switch. The connection wire is connected between the second select terminal of the first switch and the fourth select terminal of the second switch.

According to at least one example embodiment, if the control signal indicates a DC cut-off measurement mode to remove a DC component of current, then the first switch is configured to couple the first common terminal to the first select terminal, and the second switch is configured to couple the second common terminal to the third select terminal.

According to at least one example embodiment, if the control signal indicates a DC supply measurement mode to supply a DC component of current, then the first switch is configured to couple the first common terminal to the second select terminal, and the second switch is configured to couple the second common terminal to the fourth select terminal.

According to at least one example embodiment, the calculated plasma parameters include a point ion density, a point electron temperature, and a point electron density at each of the points.

According to at least one example embodiment, the processor unit is configured to control each of the DC switch circuit to connect the signal generator to each of the floating probes in a DC supply measurement mode to measure a first probe current of each of the floating probes, the first probe current including a DC component, and to connect a DC cut-off capacitor between the signal generator and each of the floating probes in a DC cut-off measurement mode to measure a second probe current of each of the floating probes, the second probe current excluding the DC component.

According to at least one example embodiment, the processor unit is configured to calculate a point ion density and a point electron temperature at each of the points based on the second probe current, and calculate an electron density ratio at each of the points based on the first probe current.

According to at least one example embodiment, the electron density ratio at each of the points is calculated using a first harmonic component in the first probe current.

According to at least one example embodiment, the sensor plate has a shape substantially identical to a shape of a wafer.

According to at least one example embodiment, an apparatus for diagnosing plasma in a plasma space includes a plurality of probes, each of the probes being configured to generate an associated probe current caused by the plasma. The apparatus includes a processor configured to generate a control signal, and a selection circuit configured to output one of first and second output currents based on the control signal. The first output current includes a DC component of an associated probe current, and the second output current excludes a DC component of an associated probe current.

According to at least one example embodiment, the apparatus further includes a sensing circuit configured to sense the first and second output currents, and a signal generator configured to apply an AC signal to the sensing circuit while the sensing circuit senses the first and second output currents. The processor is configured calculate plasma characteristics based on at least one of the sensed first and second output currents.

According to at least one example embodiment, the control signal indicates one of a first mode and a second mode, the first mode being a mode in which the selection circuit outputs the first output current, the second mode being a mode in which the selection circuit outputs the second output current.

According to at least one example embodiment, the plasma characteristics are based on an electron density ratio at each of the probes and an ion density and an electron temperature at each of the probes. The processor is configured to calculate the electron density ratio based on the sensed first output current and calculate the ion density and the electron temperature based on the sensed second output current.

In a method and/or an apparatus of diagnosing plasma according to at least one example embodiments, the electron density may be calculated, and thus the spatial characteristic of plasma may be accurately detected. Accordingly, the charging damage may be accurately predicted. Therefore, the reliability of a verification of the plasma treatment process and plasma facilities for the semiconductor device may be improved.

BRIEF DESCRIPTION OF THE DRAWINGS

Example embodiments will be more clearly understood from the following detailed description taken in conjunction with the accompanying drawings. FIGS. 1 to 12 represent non-limiting, example embodiments as described herein.

DETAILED DESCRIPTION OF EXAMPLE EMBODIMENTS

Various example embodiments will be described more fully hereinafter with reference to the accompanying drawings, in which some example embodiments are shown. The inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the sizes and relative sizes of layers and regions may be exaggerated for clarity. Like numerals refer to like elements throughout.

It will be understood that, although the terms first, second, third, etc. may be used herein to describe various elements, these elements should not be limited by these terms. These terms are used to distinguish one element from another. Thus, a first element discussed below could be termed a second element without departing from the teachings of the inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
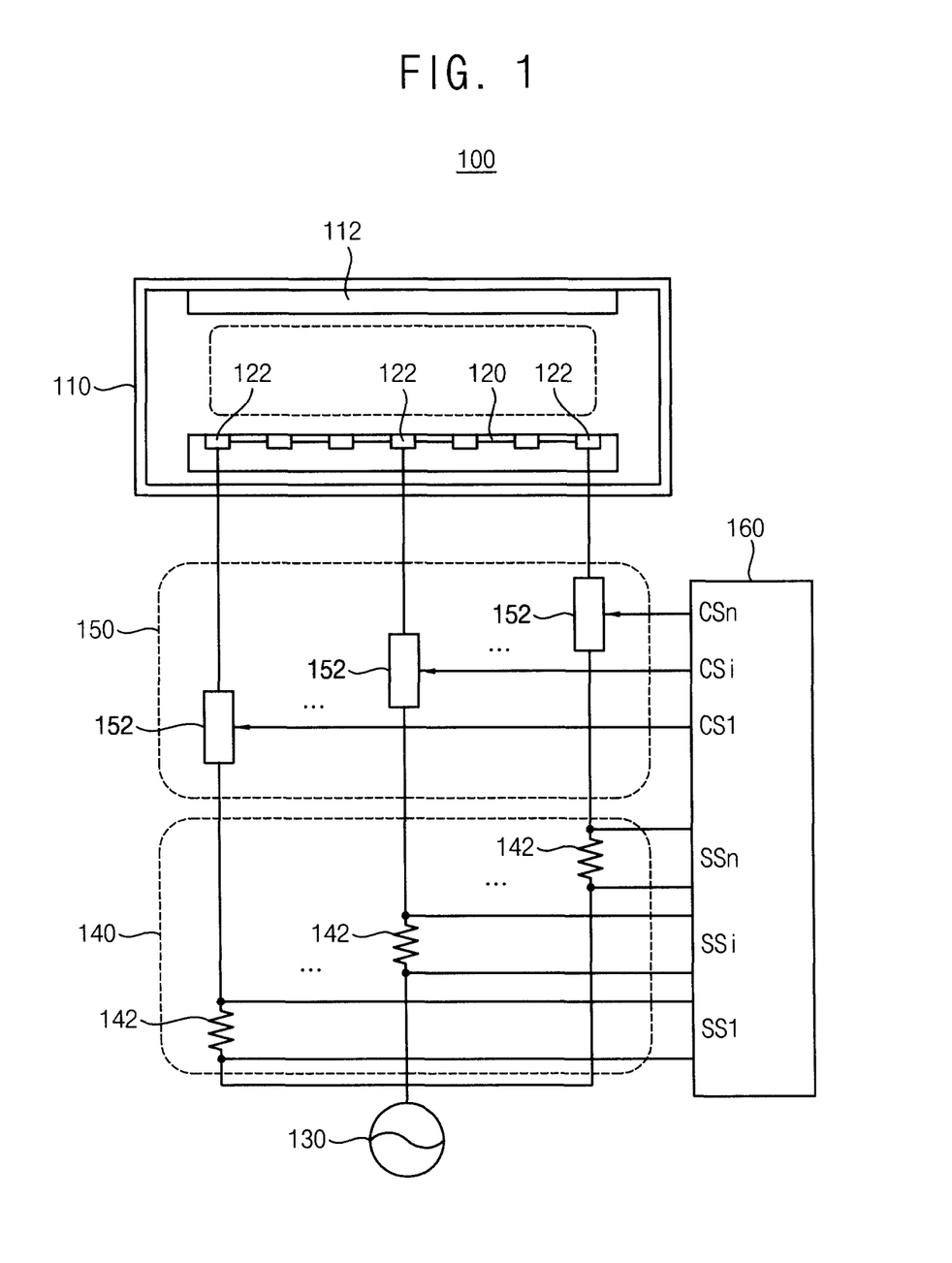
FIG. 1 is a block diagram illustrating an apparatus of diagnosing plasma according to at least one example embodiment.

FIG. 1 is a block diagram illustrating an apparatus of diagnosing plasma according to at least one example embodiment.

Referring to FIG. 1, a sensor plate 120 of an apparatus 100 for diagnosing plasma may be installed in a plasma spatial chamber 110. The sensor plate 120 is supplied with AC voltage from a signal generator 130 through a sensor circuit 140 and a DC select circuit 150. The sensor circuit 140 and the DC select circuit 150 are electrically connected to a processor unit 160. The plasma spatial chamber 110 includes a plasma generator 112. The plasma generator 112 may include at least one of an inductive-coupled plasma generator, a capacitively-coupled plasma generator, an AC plasma generator, a DC plasma generator, an ultra-high frequency plasma generator, etc. The plasma generator may operate at least one of a continuous mode or a pulse mode.

Figure 2:
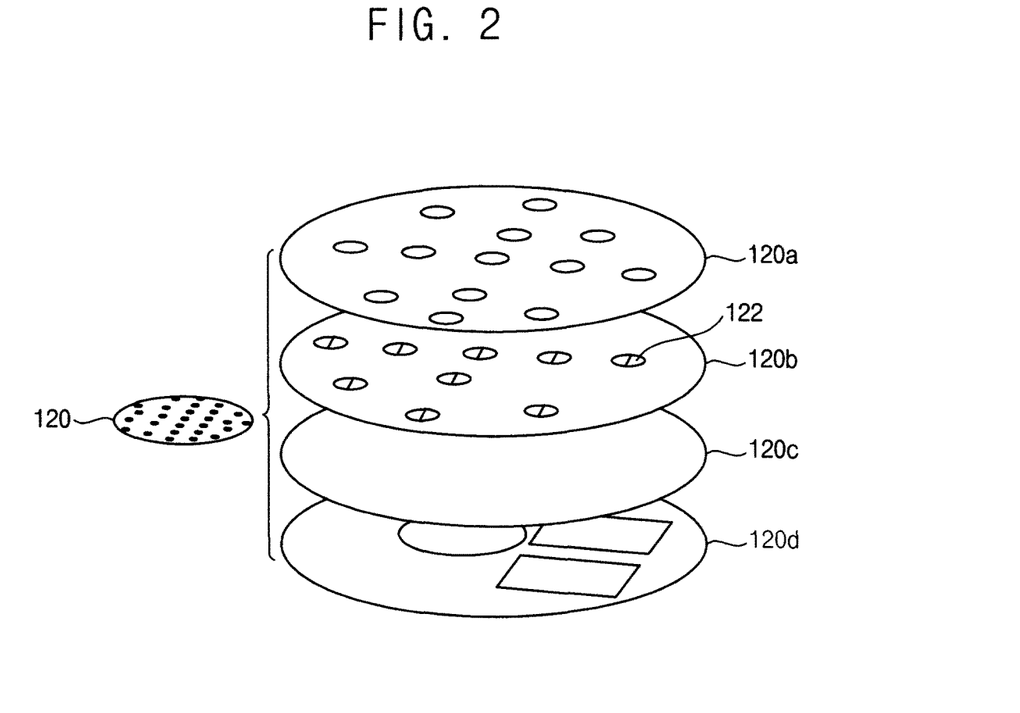
FIG. 2 is a perspective view illustrating a sensor plate according to at least one example embodiment.

FIG. 2 is a perspective view illustrating a sensor plate according to at least one example embodiment.

Referring to FIG. 2, the sensor plate 120 has the shape of a semiconductor wafer, which is suitable for the measurement of the spatial distribution of the plasma density exerting an influence on a wafer. The sensor plate 120 includes an upper insulating layer 120a, a probe sensor layer 120b, a circuit wiring layer 120c, and a lower insulating layer 120d. The upper and lower insulating layers 120a and 120d have surfaces coated with aluminum oxide ($Al_2O_3$) to maintain an electric insulating state and to protect the probe sensor layer 120b and the circuit wiring layer 120c from being contaminated and gas-etched. A plurality of floating probes 122 are uniformly provided in the probe sensor layer 120b to measure the plasma characteristics of each of a plurality of points on a 2-D plane. The circuit wiring layer 120c may include a connector or an interface circuit to electrically connect the floating probes 122 to an external measuring device. In addition, each probe 122 may be selectively coupled with a choke box. The choke box includes an LC resonance circuit including an inductor and a capacitor, which are connected in parallel, to increase impedance, so that the potential difference between the probe and plasma is significantly reduced. The LC resonance circuit allows the potential at the probe 122 to oscillate substantially identically to the RF component of the potential at the plasma, thereby reducing RF-component current of the probe 122 to inhibit (or alternatively, prevent) a floating voltage from being varied at the RF component. Accordingly, the distortion of a current signal flowing through the probe 122 may be reduced.

A voltage V generated from the signal generator 130 of FIG. 1 may be expressed as following Equation 1.

$$V = V_D \cos \omega t. \quad \text{Equation 1}$$

In Equation 1, $V_D$ represents the amplitude of the AC voltage, and ω– represents a reference angular frequency.

In FIG. 1, the sensor circuit 140 includes a plurality of current sensing resistors 142. Each current sensing resistor 142 is connected to each probe 122 in series to make the potential difference proportional to the amplitude of current flowing through the probe 122.

The DC select circuit 150 includes a plurality of DC select switch circuits 152.

Figure 3:
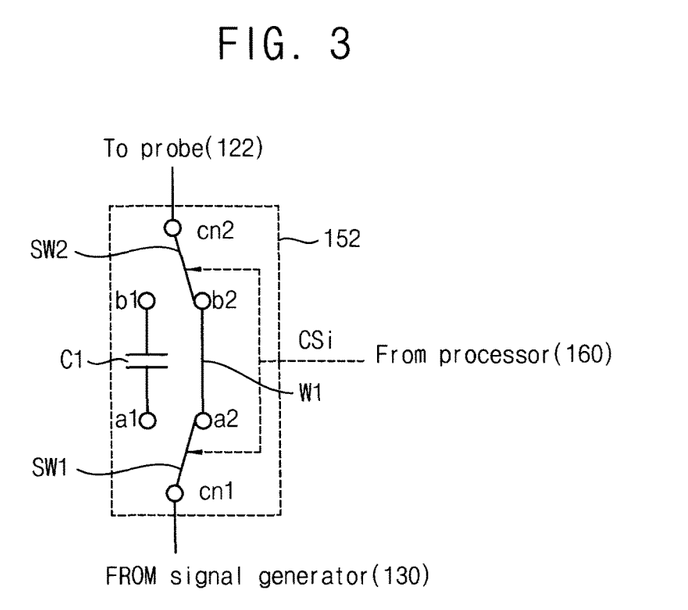
FIG. 3 is a circuit diagram illustrating a DC select switch circuit in FIG. 1 according to at least one example embodiment.

FIG. 3 is a circuit diagram illustrating a DC select switch circuit in FIG. 1 according to at least one example embodiment.

Referring to FIG. 3, each DC select switch circuit 152 includes a first switch SW1, a second switch SW2, a DC cut-off capacitor C1, and a direct connection wire W1.

The first switch SW1 includes a common terminal cn1 and two select terminals a1 and a2. The second switch SW2 includes a common terminal cn2 and two select terminals b1 and b2. An output terminal of the signal generator 130 is connected to the common terminal cn1, and the probe 122 is connected to the common terminal cn2. The DC cut-off capacitor C1 is connected between the select terminals a1 and b1, and the direct connection wire W1 is connected between the select terminals a2 and b2.

The first switches SW1 and SW2 are simultaneously switched in response to a control signal CSi of the processor unit 160. For example, if the control signal CSi is in a low state, the first switch SW1 and the second switch SW2 are switched to cn1-a1 and cn2-b1 connection states, respectively. If the control signal CSi is in a high state, the first and second switches SW1 and SW2 may be switched to cn1-a2 and cn2-b2 connection states, respectively. In other words, when the control signal CSi is in the low state, the DC cut-off capacitor C1 is connected to the probe 122 in series, so that a DC cut-off measurement mode occurs. When the control signal CSi is in the high state, the direct connection wire W1 is connected to the probe 122, so that a DC supply measurement mode occurs.

Accordingly, when the DC cut-off capacitor C1 is connected to the probe 122 in series, a DC component is cut off, so that the potential at the probe 122 oscillates substantially identically to the RF component of the plasma potential. Therefore, the DC-component current of the probe 122 is reduced to inhibit (or alternatively, prevent) a floating voltage from being varied at the RF component. Accordingly, the distortion of a current signal flowing through the probe 122 may be reduced (or alternatively, prevented).

As discussed above, the DC select switch circuits 152 may be simultaneously switched.

The processor unit 160 amplifies sensing signals SS1 and SSi to SSn corresponding to the potential difference across both terminals of each current sensing resistor 142 by using a differential amplifier and converts the amplified current signals into a voltage signal. If the voltage signal is analyzed, the amplitude of current flowing through a probe may be measured. If the potential difference is measured by using the differential amplifier, the amplitude of the current flowing through each probe 122 may be found.

In this case, even if a current having a low amplitude flows through the probe 122, the amplitude of the current flowing through the probe 122 may be accurately measured if a resistor having a suitable resistance and a differential amplifier having a suitable bandwidth are selected. The measured current is converted into voltage to be output.

In addition, the processor unit 160 generates control signals CS1 and CSi to CS having control states corresponding to the DC cut-off measurement mode and the DC supply measurement mode in response to a measurement mode signal. The generated control signals CS1 and CSi to CSn are provided as control signals to the DC select circuit 150.

In addition, since current flowing through the probe 122 contains density information and temperature information, the amplitude of the current is accurately measured, and the current signal is converted into a voltage signal having the substantially same frequency as that of the current signal. The processor unit 160 may include a Fast Fourier transform (FFT) unit to divide the converted voltage signal into units of frequency. As described above, the processor unit 160 may accurately separate the probe frequencies ω and 2ω from harmonic components by using the FFT unit or a programmable system device (PSD). In addition, the processor unit 160 may reduce noise by processing digital signals. Meanwhile, according to at least one example embodiment, the ion density may be calculated from a magnitude of the ω component of the current and provided as a plasma parameter for the purpose of plasma diagnosis.

DC Cut-Off Measurement Mode

As shown in FIG. 3, for example, a DC cut-off capacitor C1 is connected to the probe 122 in series in the DC cut-off measurement mode. Here, a probe voltage $V_B$ is expressed as $V_B = V_f + V_D \cos \omega t$. In this case, $V_f$ is an offset value or a DC bias value. Probe current $i_{pr}$ includes ion current and electron current, and may be obtained through Equation 2 below.

$$i_{pr} = i_{is} - i_{es} \exp\left[\frac{V_B - V_P}{T_e}\right] \quad \text{Equation 2}$$

In Equation 3, $i_{is}$ represents ion saturation current, $i_{es}$ represents electron saturation current, $V_P$ represents plasma voltage, and $T_e$ represents electron temperature. The electron temperature $T_e$ is determined by an electron energy distribution function.

The ion saturation current $i_{is}$ is proportional to ion density $n_i$, a Bohm speed $U_B$ and a probe area A, and may be expressed as Equation 3 below. The Bohm speed $U_B$ may depend on the electron temperature $T_e$.

$$i_{is} = 0.61 e n_i u_B A \quad \text{Equation 3}$$

The electron saturation current $i_{es}$ is proportional to the electron density $n_e$, an electron average speed $v_e$ and a probe area A, and may be expressed as Equation 4 below.

$$i_{es} = \frac{1}{4} e n_e v_e A \quad \text{Equation 4}$$

The probe voltage $V_B$ of Equation 1 is substituted into a probe current equation of Equation 2 and a Bessel Function is series-expanded to be summarized in Equation 5.

$$\begin{aligned} i_{pr} &= i_{is} - i_{es} \exp\left[\frac{(V_f + V_0 \cos \omega t) - V_P}{T_e}\right] \quad \text{Equation 5} \\ &= i_{is} - i_{es} \exp\left[\frac{V_f - V_P}{T_e}\right] \exp\left[\frac{V_0}{T_e} \cos \omega t\right] \\ &= i_{is} - i_{es} \exp\left[\frac{V_f - V_P}{T_e}\right]\left(I_0\left(\frac{V_0}{T_e}\right) + 2\sum_{k=1}^{\infty} I_k\left(\frac{V_0}{T_e}\right) \cos k\omega t\right) \\ &= i_{is} - i_{es} \exp\left[\frac{V_f - V_P}{T_e}\right] I_0\left(\frac{V_0}{T_e}\right) - \\ &\quad 2 i_{es} \exp\left[\frac{V_f - V_P}{T_e}\right]\left(\frac{V_0}{T_e}\right)(I_1 \cos \omega t + I_2 \cos 2\omega t + \ldots) \end{aligned}$$

A DC component applied to the probe 122, which is expressed in Equation 6, may be cut off by the DC cut-off capacitor such that the DC component is zero.

$$i_{DC} = i_{is} - i_{es} \exp\left[\frac{V_f - V_P}{T_e}\right] I_0\left(\frac{V_0}{T_e}\right) = 0 \quad \text{Equation 6}$$

Equation 7, which represents the relation between ion saturation current $i_{is}$ and electron saturation current $i_{es}$ is derived from Equation 6.

$$\begin{aligned} i_{is} &= i_{es} \exp\left[\frac{V_f - V_P}{T_e}\right] I_0\left(\frac{V_0}{T_e}\right) \quad \text{Equation 7} \\ \frac{i_{is}}{I_0} &= i_{es} \exp\left[\frac{V_f - V_P}{T_e}\right]\left(\frac{V_0}{T_e}\right) \end{aligned}$$

Therefore, the probe current without the DC component is summarized through Equation 8 expressed in the sum of harmonic components.

$$i_{pr} = -2i_{es}\exp\left[\frac{V_f - V_P}{T_e}\right]\left(\frac{V_0}{T_e}\right)(I_1\cos\omega t + I_2\cos 2\omega t + \ldots)$$  Equation 8

In this case, only the first harmonic component is extracted, and Equation 3 and Equation 7 are substituted into Equation 8 to be summarized in Equation 9.

$$i_{1w} = -2i_{es}\exp\left[\frac{V_f - V_P}{T_e}\right]\left(\frac{V_0}{T_e}\right)(I_1\cos\omega t)$$

$$= -2i_{is}\left(\frac{I_1}{I_0}\right)\cos\omega t$$

$$= -2(0.61en_iu_BA)\left(\frac{I_1}{I_0}\right)\cos\omega t$$  Equation 9

In Equation 9, since the first harmonic component may be obtained by separating a frequency by the processor unit 160, ion density $n_i$ may be calculated.

Similarly, if the ratio of the first harmonic component to the second harmonic component is calculated by extracting the second harmonic component, the relation of the electron temperature $T_e$ is derived in Equation 10.

$$\frac{|i_{1w}|}{|i_{2w}|} = \frac{I_1\left(\frac{V_0}{T_e}\right)}{I_2\left(\frac{V_0}{T_e}\right)}$$  Equation 10

Accordingly, through Equations 9 and 10, a point ion density $n_i$ and a point electron temperature $n_{i,\,pi}$ are calculated with respect to each probe 122 in all points of the sensor plate 120.

DC Supply Measurement Mode

After the point ion density $n_{i,\,pi}$ and the point electron temperature $T_{e,\,pi}$ have been calculated in the DC cut-off measurement mode, the switching of the DC select circuit 150 is controlled to disconnect the series-connection of the DC cut-off capacitor C1, and apply the output of the signal generator 130 to the probe 122.

Since the probe 122 is not floated in the state that the DC cut-off capacitor C1 is removed, $V_f$ becomes 0.

In addition, since the DC component cannot be 0, Equation 6 is modified following Equation 11.

$$i_{DC} = i_{is} - i_{es}\exp\left[\frac{0 - V_P}{T_e}\right]I_0\left(\frac{V_0}{T_e}\right)$$  Equation 11

Accordingly, the first harmonic component is summarized in Equation 12.

$$i_{1w} = -2i_{es}\exp\left[\frac{0 - V_P}{T_e}\right]\left(\frac{V_0}{T_e}\right)(I_1\cos\omega t)$$

$$= -2i_{es}\exp\left[\frac{-V_P}{T_e}\right]\left(\frac{V_0}{T_e}\right)(I_1\cos\omega t)$$  Equation 12

Accordingly, the magnitude of the first harmonic component is summarized in Equation 13 by substituting the electron saturation current $i_{es}$ of Equation 4 into Equation 12.

$$|i_{1w,NC}| = i_{es}\exp\left[\frac{-V_P}{T_e}\right]\left(\frac{V_0}{T_e}\right)I_1 = \frac{1}{4}\bar{v}n_e\exp\left[\frac{-V_P}{T_e}\right]\left(\frac{V_0}{T_e}\right)I_1$$  Equation 13

Although the absolute value of the magnitude of the first harmonic component is difficult to measure, the ratio between several measurement points may be calculated. In other words, the magnitudes of the first harmonic components at points p1 and p2 can be expressed as Equations 14 and 15, respectively.

$$|i_{1w,NC,p1}| = \frac{1}{4}\bar{v}n_{e,p1}\exp\left[\frac{-V_{P,p1}}{T_{e,p1}}\right]\left(\frac{V_0}{T_{e,p1}}\right)I_1$$  Equation 14

$$|i_{1w,NC,p2}| = \frac{1}{4}\bar{v}n_{e,p2}\exp\left[\frac{-V_{P,p2}}{T_{e,p2}}\right]\left(\frac{V_0}{T_{e,p2}}\right)I_1$$  Equation 15

The normalizing of the value at the point p2 in relation to the point p1 may be summarized by Equation 16.

$$\frac{|i_{1w,NC,p2}|}{|i_{1w,NC,p1}|} = \frac{n_{e,p2}\exp\left[\frac{-V_{P,p2}}{T_{e,p2}}\right]T_{e,p2}}{n_{e,p1}\exp\left[\frac{-V_{P,p1}}{T_{e,p1}}\right]T_{e,p1}}$$  Equation 16

In this case, the electron temperatures $T_{e,\,p1}$ and $T_{e,\,p2}$ at the points are obtained through the measurement in Equation 10. In this case, Equation 16 may be summarized in Equation 17 in which C represents a constant.

$$\frac{n_{e,p2}}{n_{e,p1}} = c\frac{|i_{1w,NC,p2}|}{|i_{1w,NC,p1}|}\exp(-\Delta V_P)$$  Equation 17

In Equation 17, using the assumption that the plasma voltages at the points are substantially the same since the plasma voltage difference between the points is very small, $\Delta V_p = 0$ and the ratio in Equation 17 may be calculated. Therefore, since the ratio at each point in the electron density may be found, the spatial distribution of the electron density may be found.

Figure 4:
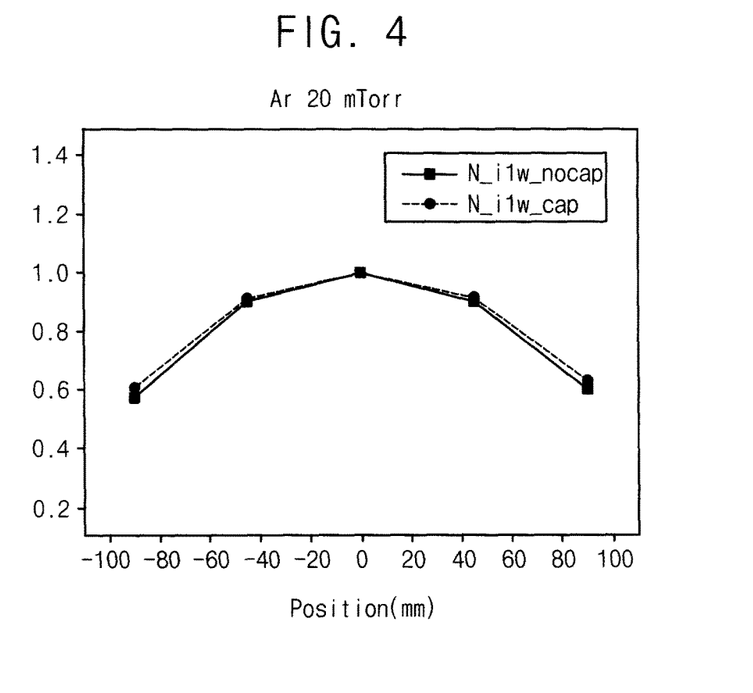
FIG. 4 is a diagram illustrating magnitudes of ion density and electron density according to a measurement position of Ar plasma in an apparatus of diagnosing plasma according to at least one example embodiment.

FIG. 4 is a diagram illustrating magnitudes of ion density and electron density according to a measurement position of Ar plasma in an apparatus of diagnosing plasma according to an example embodiment. In the graph of FIG. 4, a horizontal axis represents a probe measurement position, and a vertical axis represents the density magnitude. One curve represents the magnitude of the ion density according to the measurement position in the DC cut-off measurement mode in which the DC cut-off capacitor is connected (i.e., N_i 1w_cap); and the other curve represents the magnitude of the electron density according to the measurement position at the DC supply measurement mode in which the DC cut-off capacitor is removed (i.e., N_i 1w_nocap).

As illustrated in FIG. 4, in Ar plasma, that is, positive plasma including only cations and electrons, the magnitude of the ion density is substantially equal to the magnitude of the electron density. Further, the density magnitude at the center of the measurement position is greater than the density magnitude at the edge of the measurement position.

Figure 5:
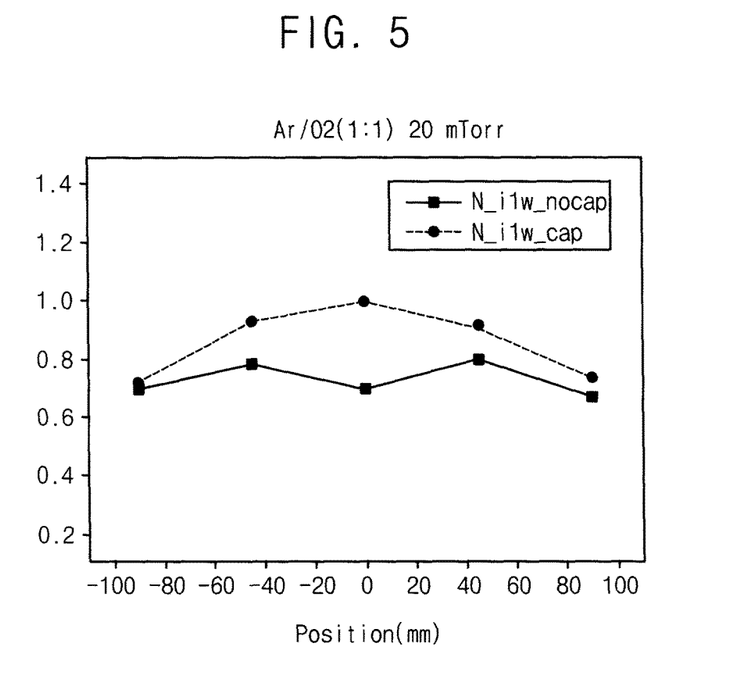
FIG. 5 is a diagram illustrating magnitudes of ion density and electron density according to a measurement position of Ar/O2 plasma in an apparatus of diagnosing plasma according to at least one example embodiment.

FIG. 5 is a diagram illustrating magnitudes of ion density and electron density according to a measurement position of Ar/$O_2$ plasma in an apparatus of diagnosing plasma according to at least one example embodiment. The dashed curve represents the magnitude of the ion density according to the measurement position in the DC cut-off measurement mode when the DC cut-off capacitor is connected (i.e., N_i 1w_cap); and the bold (or solid) curve represents the magnitude of the electron density according to the measurement position in the DC supply measurement mode when the DC cut-off capacitor is removed (i.e., N_i 1w_nocap).

As illustrated in FIG. 5, in the plasma obtained by mixing Ar with O2 at the ratio of 1:1, the total quantity of electric charges of cations is represented as the sum of the quantity of electric charges of anions and electrons. Therefore, in the negative plasma in which anions exist, the magnitude of the electron density is not equal to the magnitude of the ion density due to an anion density distribution. The bold curve represents a distribution characteristic in which the density magnitude at the center is lower than that at the surroundings.

Figure 6:
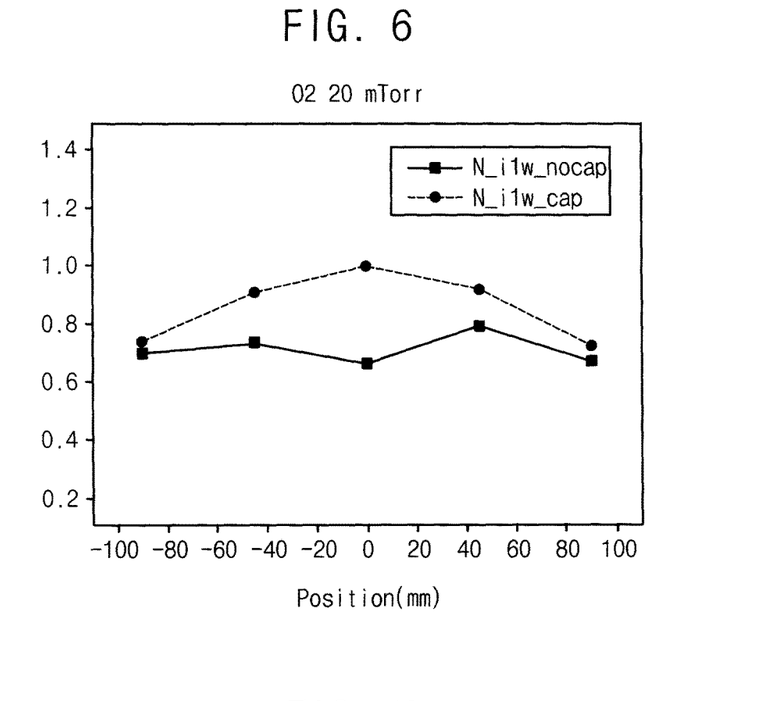
FIG. 6 is a diagram illustrating the magnitudes of ion density and electron density according to a measurement position of O2 plasma in an apparatus of diagnosing plasma according to at least one example embodiment.

FIG. 6 is a diagram illustrating the magnitudes of ion density and electron density according to a measurement position of $O_2$ plasma in an apparatus of diagnosing plasma according to at least one example embodiment. The dashed curve represents the magnitude of the ion density according to the measurement position in the DC cut-off measurement mode when the DC cut-off capacitor is connected (i.e., N_i 1w_cap); and the bold curve represents the magnitude of the electron density according to the measurement position in the DC supply measurement mode when the DC cut-off capacitor is removed (i.e., N_i 1w_nocap).

Referring to FIG. 6, in the negative plasma in which anions exist, the anion density is not equal to the electron density. In the bold curve, the electron density at the center is less than the electron density at the surroundings.

Figure 7:
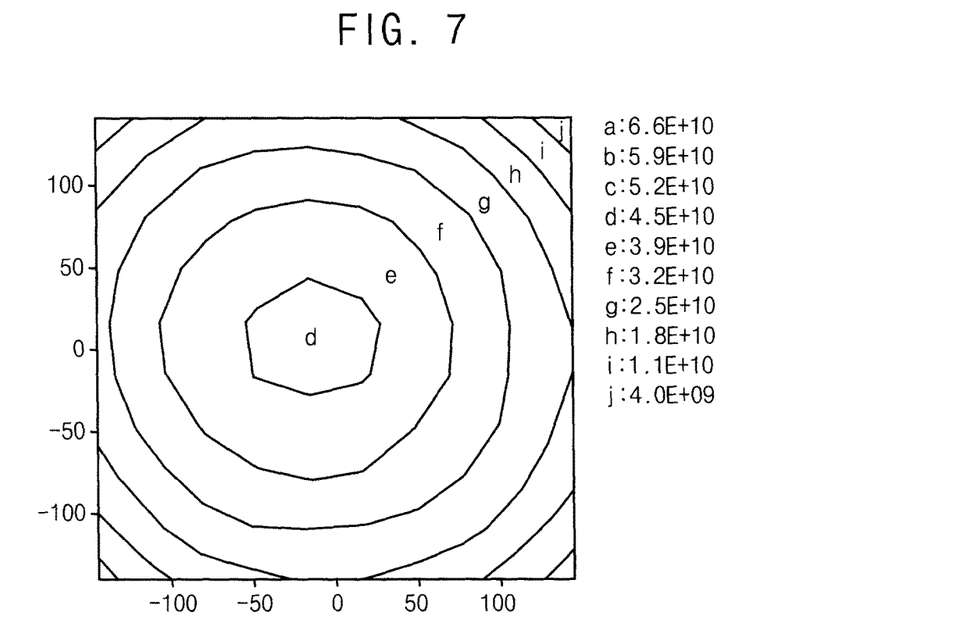
FIG. 7 is a diagram illustrating a spatial distribution of an ion density in 20 m torr/400 W-Ar plasma in a form of a contour.
Figure 8:
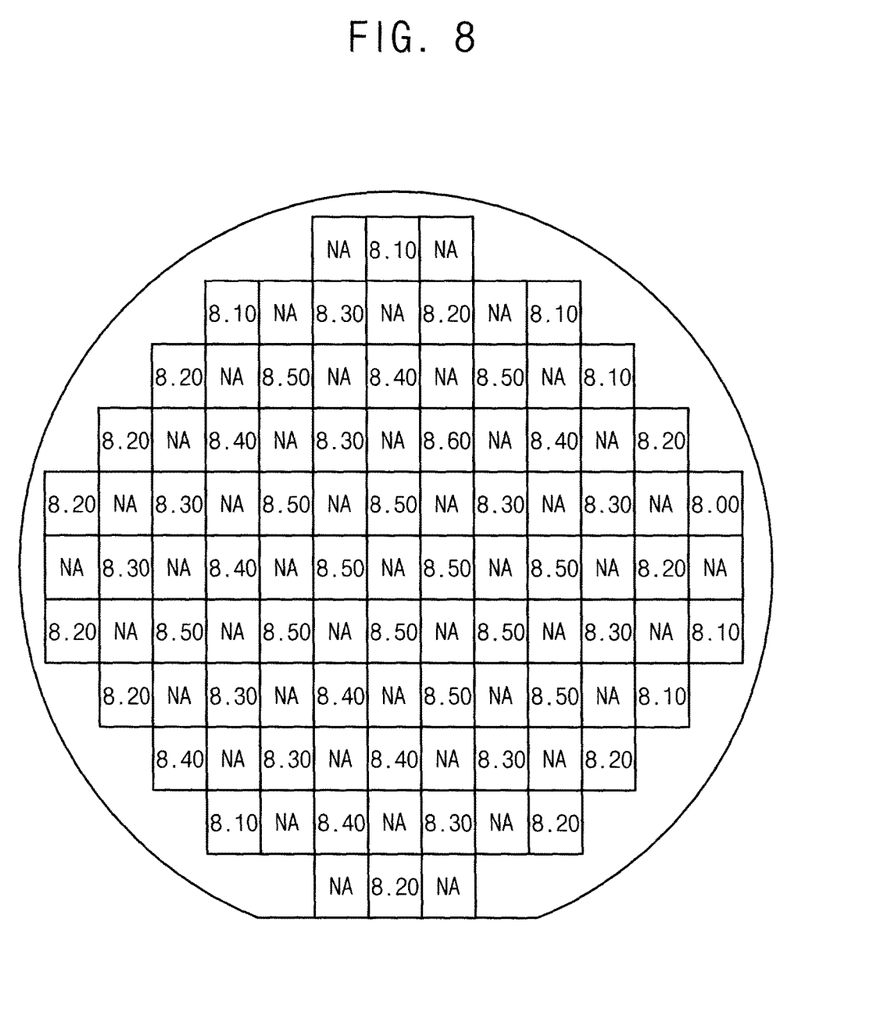
FIG. 8 is a diagram illustrating a damage spatial distribution represented on a two-dimensional plane by an SPDM (simple plasma damage monitor) in a 20 m torr/400 W-Ar plasma state.

FIG. 7 is a diagram illustrating a spatial distribution of an ion density in 20 m torr/400 W-Ar plasma in a form of a contour, and FIG. 8 is a diagram illustrating a spatial distribution of damage represented on a two-dimensional plane by an SPDM (simple plasma damage monitor) in a 20 m torr/400 W-Ar plasma state. In FIG. 8, each number indicates damage at a corresponding point, and NA indicates a point at which damage is not measured. The damage becomes increasingly serious as the number decreases.

A SPDM (simple plasma damage monitor) is a device to monitor the level of charging damage of an MOS capacitor array sensor caused by plasma when the MOS capacitor array sensor is exposed to the plasma. When a difference between ion density and electron density occurs, the oxide layer of the MOS capacitor is degraded, so that the breakdown voltage of the MOS capacitor is reduced. The damage degree is represented by the magnitude of the breakdown voltage.

Referring to FIG. 7, the ion density is high at the center, and lower toward the surroundings. Referring to FIG. 8, the damage value at the center is 8.50, and the damage value in the surrounding portions is in the range of 8.10 to 8.20. Accordingly, the damage at the center is less than the damage at surrounding portions.

Figure 9:
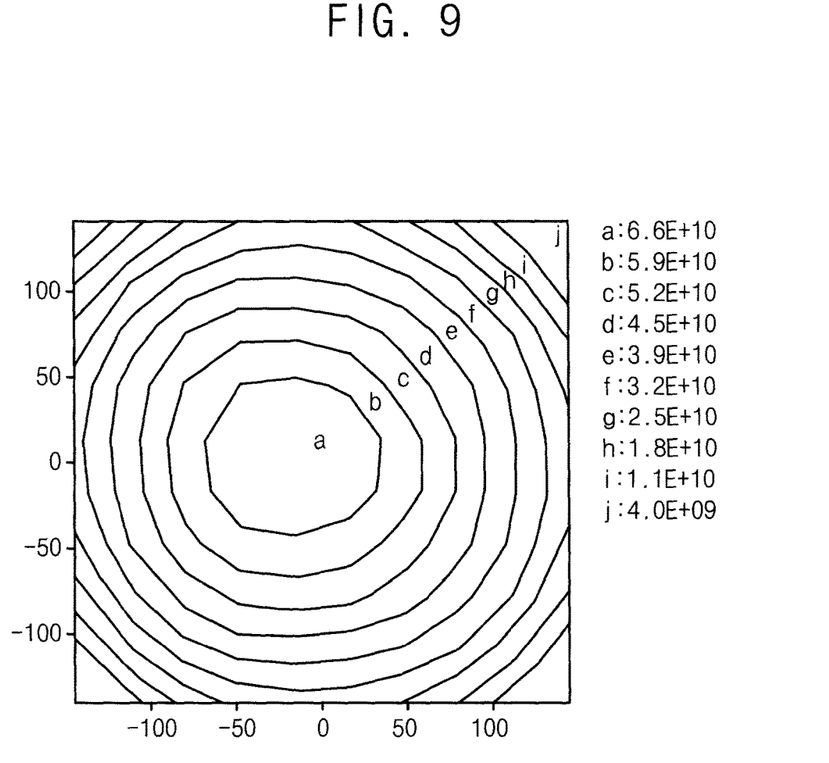
FIG. 9 is a diagram illustrating a spatial distribution of an ion density in 80 m torr/400 W-Ar plasma in a form of a contour.
Figure 10:
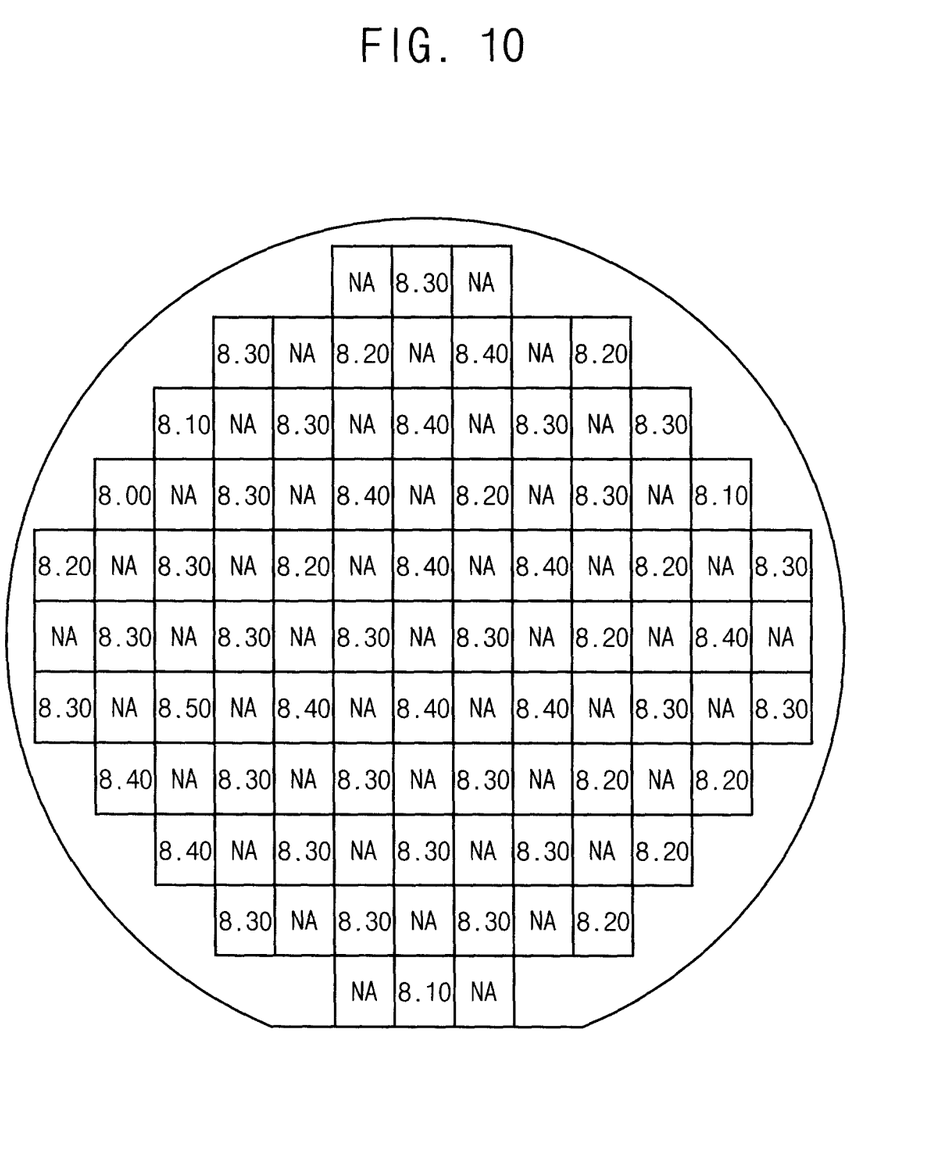
FIG. 10 is a diagram illustrating a spatial distribution of damage represented on a two-dimensional plane by an SPDM in an 80 m torr/400 W-Ar plasma state.

FIG. 9 is a diagram illustrating a spatial distribution of an ion density in 80 m torr/400 W-Ar plasma in a form of a contour, and FIG. 10 is a diagram illustrating a spatial distribution of damage represented on a two-dimensional plane by an SPDM in an 80 m torr/400 W-Ar plasma state. In FIG. 10, each number indicates a damage at a corresponding point, and NA indicates a point at which a damage is not measured. The damage becomes increasingly serious as the number decreases.

Referring to FIG. 9, as a higher vacuum state is caused, the ion density is more concentrated on the center, and the ion density is rapidly lowered toward the surroundings. Referring to FIG. 10, although the spatial distribution of the density is changed due to the high vacuum state, the damage value is in the range of 8.50 to 8.10.

Figure 11:
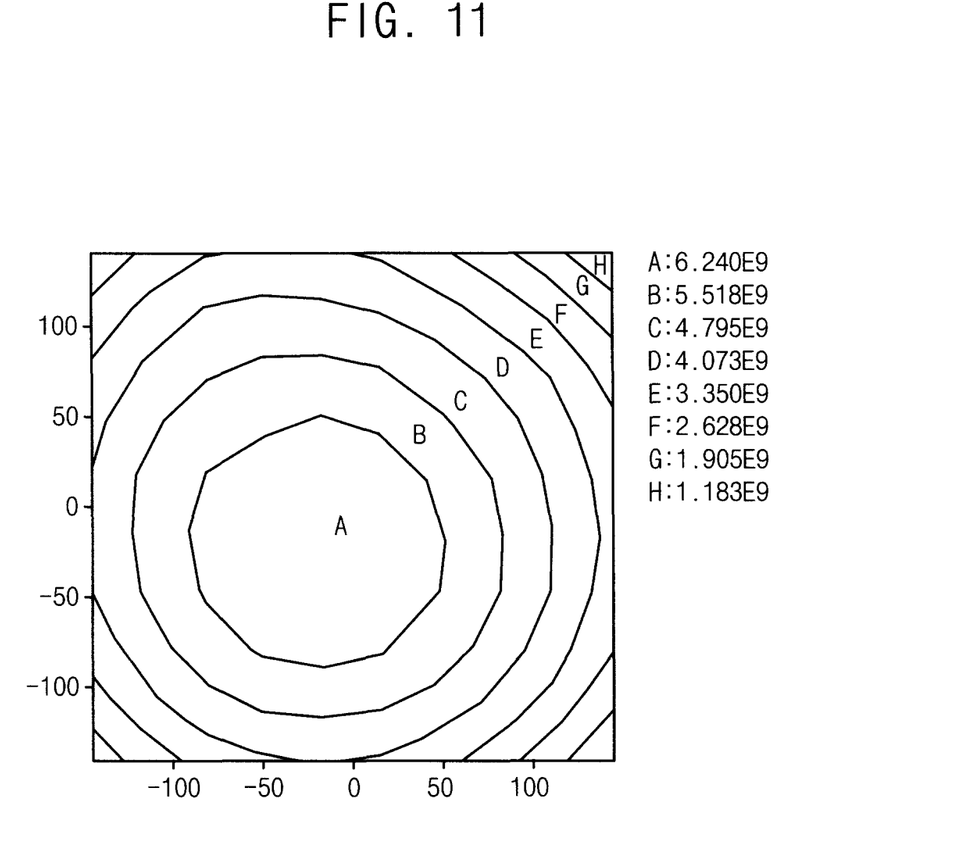
FIG. 11 is a diagram illustrating a spatial distribution of an ion density in 20 m torr/400 W-O2 Plasma in a form of a contour.
Figure 12:
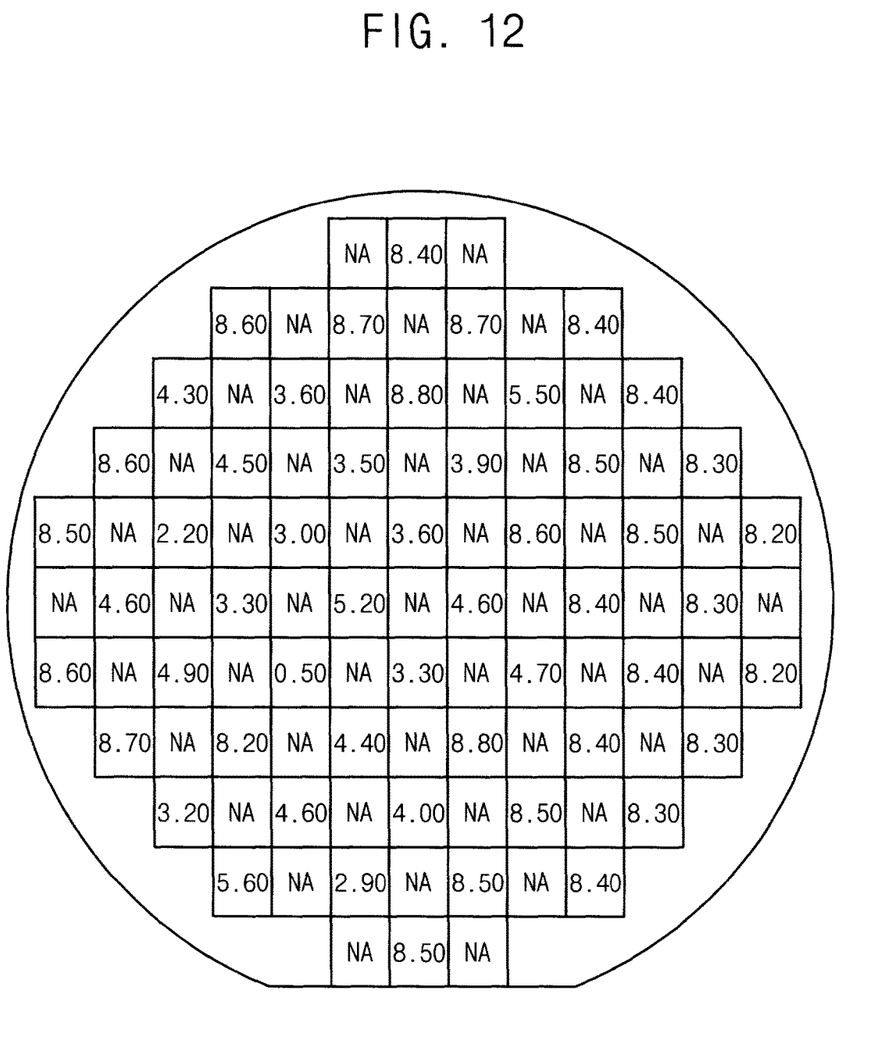
FIG. 12 is a diagram illustrating damage spatial distribution represented on a two-dimensional plane by an SPDM in a 20 m torr/400 W-O2 plasma state.

FIG. 11 is a diagram illustrating a spatial distribution of an ion density in 20 m torr/400 W-O2 Plasma in a form of a contour, and FIG. 12 is a diagram illustrating damage spatial distribution represented on a two-dimensional plane by an SPDM in a 20 m torr/400 W-O2 plasma state. In FIG. 12, each number indicates a damage at a corresponding point, and NA indicates a point at which a damage is not measured. The damage becomes increasingly serious as the number decreases.

Referring to FIG. 11, when comparing with the Ar plasma, the ion density at the center is higher, and the difference in the ion density between the center and the surroundings is relatively great. Referring to FIG. 12, when comparing to the damage distribution by the Ar plasma, significantly serious damage of 3.90 or less is caused.

Accordingly, the spatial distribution of the ion density is higher at the center rather than the surroundings, which represents an irregular distribution state. Even though charging damage is not caused as a result of a vacuum degree in the positive plasma, the charging damage is caused in the negative plasma, which indirectly indicates the difference between the ion density and the electron density in the negative plasma.

According to at least one example embodiment, plasma parameters may be diagnosed by distinguishing between ion density and electron density in negative plasma equipment using complex reactive process gas. Accordingly, a determination may be made in relation to which one of ions and radicals of reactive process gas exerts a greater influence on the process. In addition, since the electron density may be measured, a damage phenomenon may be analyzed. Accordingly, at least one example embodiment is useful for a field of diagnosing negative plasma, plasma process analysis, and/or a plasma device controller.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An apparatus for diagnosing plasma in a plasma space, the apparatus comprising:
   a plurality of floating probes arranged at a plurality of points, respectively, in a plasma space, a height of the floating probes corresponding to a height of a wafer to be disposed in a wafer plasma process chamber defining the plasma space;
   a sensor circuit including a plurality of current sensing resistors;
   a DC select circuit including a plurality of DC switch circuits, each of the DC switch circuits being connected in series between each of the current sensing resistors and each of the floating probes; and a processor configured to calculate an electron density ratio at each of the points based on a first probe current of each of the floating probes, the first probe current including a DC component.

2. The apparatus of claim 1, wherein the processor is configured to calculate a point ion density and a point electron temperature at each of the points based on a second probe current of each of the floating probes before calculating an electron density ratio, the second probe current excluding the DC component.

3. The apparatus of claim 1, wherein the processor is configured to,
measure the first probe current by coupling a signal generator to each of the floating probes, and
measure the second probe current by connecting a DC cut-off capacitor between the signal generator and each of the floating probes.

4. The apparatus of claim 1, wherein the processor is configured to calculate the electron density using a first harmonic component in the first probe current.

5. The apparatus of claim 1, wherein the floating probes are arranged in a two-dimensional plane at a substantially same height in the plasma space.

6. The apparatus of claim 5, wherein the two-dimensional plane has a shape substantially identical to a shape of a wafer.

7. An apparatus for diagnosing plasma in a plasma space, the apparatus comprising:
a plurality of floating probes arranged at a plurality of points, respectively, in a plasma space:
a sensor plate on which the floating probes are uniformly arranged;
a signal generator configured to generate an AC signal;
a sensor circuit including a plurality of current sensing resistors connected to the signal generator;
a DC select circuit including a plurality of DC switch circuits, each of the DC switch circuits being connected in series between each of the current sensing resistors and each of the floating probes, each of the DC switch circuits being configured to control an electrical connection between each of the current sensing resistors and each of the floating probes in response a control signal; and
a processor unit configured to,
generate the control signal to control the DC select circuit,
measure a potential difference across each of the current sensing resistors,
and calculate plasma parameters based on the measured potential differences.

8. The apparatus of claim 7, wherein each of the DC switch circuits comprises:
a first switch including a first common terminal configured to receive the AC signal from the signal generator and first and second select terminals;
a second switch including a second common terminal configured to connect to each of the floating probes and third and fourth select terminals;
a DC cut-off capacitor configured to connect between the first select terminal of the first switch and the third select terminal of the second switch; and
a connection wire connected between the second select terminal of the first switch and the fourth select terminal of the second switch.

9. The apparatus of claim 8, wherein, if the control signal indicates a DC cut-off measurement mode to remove a DC component of current,
the first switch is configured to couple the first common terminal to the first select terminal, and
the second switch is configured to couple the second common terminal to the third select terminal.

10. The apparatus of claim 8, wherein, if the control signal indicates a DC supply measurement mode to supply a DC component of current,
the first switch is configured to couple the first common terminal to the second select terminal, and
the second switch is configured to couple the second common terminal to the fourth select terminal.

11. The apparatus of claim 7, wherein the calculated plasma parameters include a point ion density, a point electron temperature, and a point electron density at each of the points.

12. The apparatus of claim 7, wherein the processor unit is configured to control each of the DC switch circuits:
to connect the signal generator to each of the floating probes in a DC supply measurement mode to measure a first probe current of each of the floating probes, the first probe current including a DC component; and
to connect a DC cut-off capacitor between the signal generator and each of the floating probes in a DC cut-off measurement mode to measure a second probe current of each of the floating probes, the second probe current excluding the DC component.

13. The apparatus of claim 12, wherein the processor unit is configured to,
calculate a point ion density and a point electron temperature at each of the points based on the second probe current, and
calculate an electron density ratio at each of the points based on the first probe current.

14. The apparatus of claim 13, wherein the electron density ratio at each of the points is calculated using a first harmonic component in the first probe current.

15. The apparatus of claim 7, wherein the sensor plate has a shape substantially identical to a shape of a wafer.

16. An apparatus for diagnosing plasma in a plasma space, the apparatus comprising:
a plurality of probes, each of the probes being configured to generate an associated probe current caused by the plasma, the probes being arranged in a two-dimensional plane at a substantially same height in the plasma space, the two-dimensional plane having a shape substantially identical to a shape of a wafer;
a processor configured to generate a control signal; and
a selection circuit configured to output one of first and second output currents based on the control signal, the first output current including a DC component of an associated probe current, the second output current excluding a DC component of an associated probe current.

17. The apparatus of claim 16, further comprising:
a sensing circuit configured to sense the first and second output currents; and
a signal generator configured to apply an AC signal to the sensing circuit while the sensing circuit senses the first and second output currents, wherein the processor is configured calculate plasma characteristics based on at least one of the sensed first and second output currents.

18. The apparatus of claim 17, wherein the control signal indicates one of a first mode and a second mode, the first mode being a mode in which the selection circuit outputs the first output current, the second mode being a mode in which the selection circuit outputs the second output current.

19. The apparatus of claim 18, wherein the plasma characteristics are based on an electron density ratio at each of the probes and an ion density and an electron temperature at each of the probes, and the processor is configured to calculate the electron density ratio based on the sensed first output current and calculate the ion density and the electron temperature based on the sensed second output current.

* * * * *